United States Patent
Lai et al.

(10) Patent No.: US 10,928,743 B2
(45) Date of Patent: Feb. 23, 2021

(54) MULTI-SUBSTRATE PROCESSING ON DIGITAL LITHOGRAPHY SYSTEMS

(71) Applicant: Applied Materials, Inc., Santa Clara, CA (US)

(72) Inventors: Chien-Hua Lai, Taichung (TW);
Chia-Hung Kao, Keelung (TW);
Hsiu-Jen Wang, Taichung (TW);
Shih-Hao Kuo, Hsinchu (TW);
Yi-Sheng Liu, Tzubei (TW);
Shih-Hsien Lee, Hsinchu (TW);
Ching-Chang Chen, Tainan (TW);
Tsu-Hui Yang, Dongkung Town (TW)

(73) Assignee: APPLIED MATERIALS, INC., Santa Clara, CA (US)

( * ) Notice: Subject to any disclaimer, the term of this patent is extended or adjusted under 35 U.S.C. 154(b) by 24 days.

(21) Appl. No.: 16/358,323

(22) Filed: Mar. 19, 2019

(65) Prior Publication Data

US 2019/0369499 A1    Dec. 5, 2019

Related U.S. Application Data

(60) Provisional application No. 62/678,361, filed on May 31, 2018.

(51) Int. Cl.
*G03F 7/20* (2006.01)
*G03F 9/00* (2006.01)

(52) U.S. Cl.
CPC ........ *G03F 9/7034* (2013.01); *G03F 7/70383* (2013.01)

(58) Field of Classification Search
CPC . G03F 9/7034; G03F 7/70383; G03F 7/70691
See application file for complete search history.

(56) References Cited

U.S. PATENT DOCUMENTS

| | | | |
|---|---|---|---|
| 10,114,297 B2 | 10/2018 | Laidig et al. | |
| 2003/0071981 A1* | 4/2003 | Ueta | G03F 7/70725 355/72 |

(Continued)

FOREIGN PATENT DOCUMENTS

| | | |
|---|---|---|
| JP | 2006234921 A | 9/2006 |
| JP | 2013174737 A | 9/2013 |
| WO | 2017077532 A1 | 5/2017 |

OTHER PUBLICATIONS

PCT International Search Report and Written Opinion dated Jul. 3, 2019 for International Application No. PCT/US2019/022806.

(Continued)

*Primary Examiner* — Eliza W Osenbaugh-Stewart
(74) *Attorney, Agent, or Firm* — Patterson + Sheridan LLP (57) ABSTRACT

Embodiments herein beneficially enable simultaneous processing of a plurality of substrates in a digital direct write lithography processing system. In one embodiment a method of processing a plurality of substrate includes positioning a plurality of substrates on a substrate carrier of a processing system, positioning the substrate carrier under the plurality of optical modules, independently leveling each of the plurality of substrates, determining offset information for each of the plurality of substrates, generating patterning instructions based on the offset information for each of the plurality of substrates, and patterning each of the plurality of substrates using the plurality of optical modules. The processing system comprises a base, a motion stage disposed on the base, the substrate carrier disposed on the motion stage, a bridge disposed above a surface of the base and separated therefrom, and a plurality of optical modules disposed on the bridge.

20 Claims, 7 Drawing Sheets

(56) References Cited

U.S. PATENT DOCUMENTS

| | | |
|---|---|---|
| 2007/0170617 A1 | 7/2007 | Choi et al. |
| 2007/0296936 A1* | 12/2007 | Kato .................. G03F 7/70791 355/52 |
| 2010/0273314 A1* | 10/2010 | Ishikawa ............ C23C 16/4583 438/478 |
| 2011/0037824 A1 | 2/2011 | Usami |
| 2011/0141448 A1 | 6/2011 | Aoki et al. |
| 2011/0163065 A1 | 7/2011 | Verhaverbeke et al. |
| 2012/0073975 A1 | 3/2012 | Ganti |
| 2014/0253895 A1* | 9/2014 | Wu .................... G03F 7/70741 355/71 |

OTHER PUBLICATIONS

Taiwan Office Action dated Apr. 29, 2020, for Taiwan Patent Application No. 108112194.

\* cited by examiner

MULTI-SUBSTRATE PROCESSING ON DIGITAL LITHOGRAPHY SYSTEMS

CROSS-REFERENCE TO RELATED APPLICATIONS

This application claims priority to U.S. Provisional Application Ser. No. 62/678,361 filed on May 31, 2018, which is herein incorporated by reference in its entirety.

BACKGROUND

Field

Embodiments described herein generally relate to the field of electronic device manufacturing, and more particularly, to apparatus used to simultaneously process a plurality of substrates, or a single substrate, in a maskless lithography system and methods related thereto.

Description of the Related Art

Maskless lithography, such as direct write digital lithography, is often used in the manufacturing of flat panel displays (FPDS) which operate using thin film transistors (TFTs). A plurality of display devices are often manufactured on a single large area thin rectangular sheet of glass, herein a panel, which is then divided into the individual display devices formed thereon, such as computer monitor screens, touch panel device screens, cell phone screens, and television screens. In a typical direct write digital lithography process one or more lithography exposure sources, e.g., a UV light source, is used to direct and, or, focus radiation to, on, or below the surface of a photo-sensitive resist layer deposited on a surface of the panel. Typically, the panel is disposed on, and secured to, a motion stage which moves the panel under the lithography exposure source enabling a desired pattern to be formed in the resist layer thereof. For large area panels, a direct write digital lithography processing system will include a plurality of lithography exposure sources each configured to expose a pattern on a portion of the panel as the stage supporting the panel moves therebeneath. Typically, a processing system designed to handle and process relatively large area panels, i.e., larger processing systems, is desirable over smaller processing systems due to economies of scale.

Unfortunately, the same economies of scale that make larger processing systems desirable for the manufacturing of flat panel displays make the same processing systems undesirable for processing of smaller substrates, such as substrates used in wafer level semiconductor device packaging schemes. This is because such processing systems are typically configured to process only a single substrate at a time making the size and cost of the processing system prohibitive for the processing of smaller substrates.

Accordingly, there is a need in the art for apparatus and methods for currently processing a plurality of substrates in a direct write digital lithography processing system.

SUMMARY

Embodiments described herein generally relate to the field of electronic device manufacturing, and more particularly, to methods of simultaneously processing a plurality of substrates in a maskless lithography system, such as a digital direct write lithography system, and apparatus related thereto.

In one embodiment, a method of processing a plurality of substrate includes positioning the plurality of substrates on a substrate carrier of a processing system. Herein, the processing system comprises a base, a motion stage disposed on the base, the substrate carrier disposed on the motion stage, a bridge disposed above a surface of the base and separated therefrom, and a plurality of optical modules disposed on the bridge. The method further includes positioning the substrate carrier under the plurality of optical modules, independently leveling each of the plurality of substrates, determining offset information for each of the plurality of substrates, generating patterning instructions based on the offset information for each of the plurality of substrates, and patterning each of the plurality of substrates using the plurality of optical modules.

In another embodiment, a substrate carrier includes a plurality of carrier modules. Each of the carrier modules includes a base plate, a plurality of Z-direction actuators disposed on the base plate, and a carrier plate disposed on the plurality of Z direction-actuators.

In another embodiment, a processing system includes a base, a motion stage disposed on the base, a substrate carrier disposed on the motion stage, the substrate carrier comprising a plurality of carrier modules, a bridge disposed above a surface of the base and separated therefrom, and a plurality of optical modules disposed on the bridge.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to the field of electronic device manufacturing, and more particularly, to methods of concurrently processing a plurality of substrates in a maskless lithography system, such as a digital direct write lithography system, and apparatus related thereto. Simultaneous processing of a plurality of substrates results in increased substrate processing throughput (substrates processed per unit time per processing system) which desirably lowers substrate processing cycle time and substrate processing costs. Further embodiments described herein provide for a substrate carrier configurable to process large area panels requiring relatively minimal conversion time between a multi-substrate processing configuration and a single panel processing configuration of the processing system.

Figure 1A:
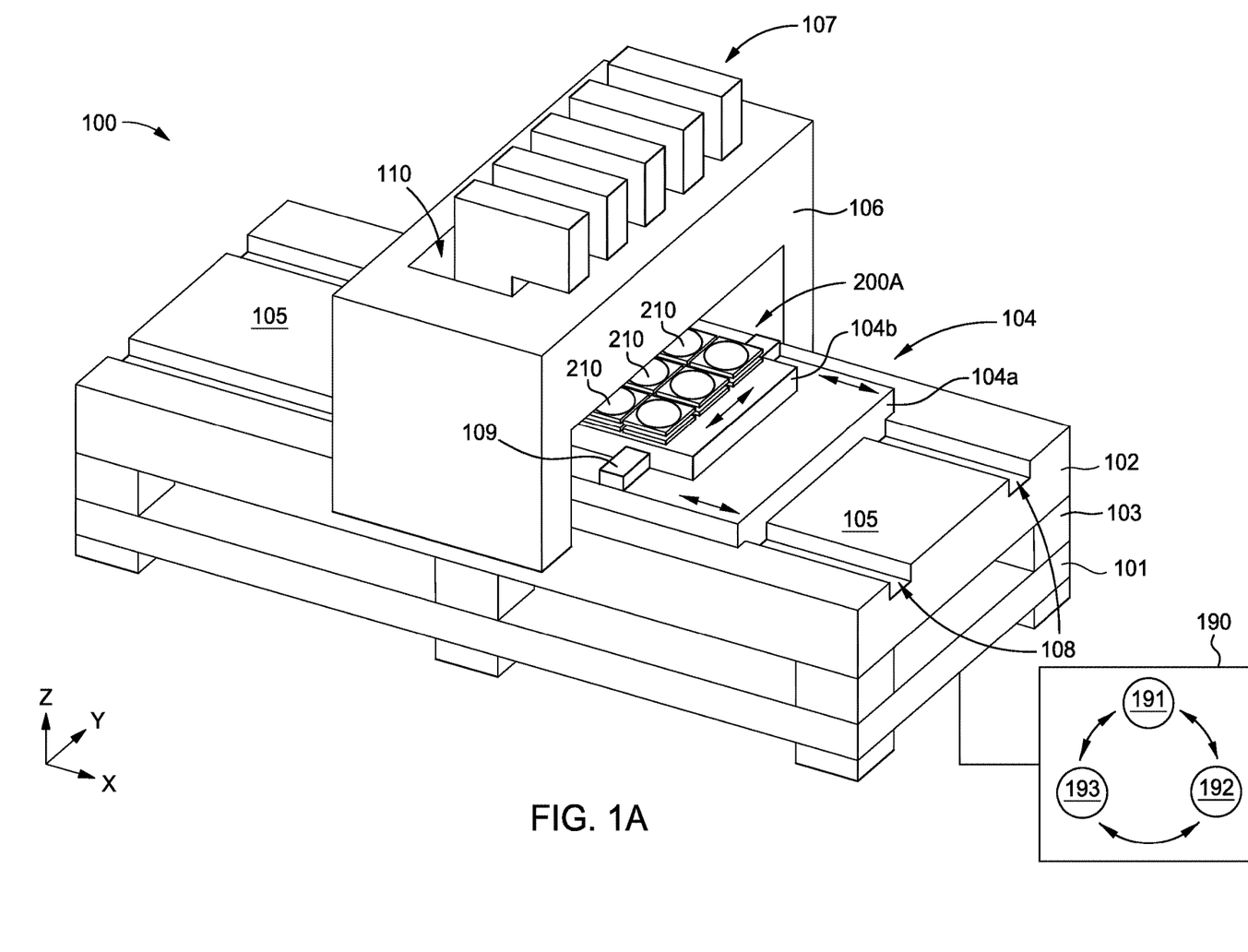
FIG. 1A is a schematic isometric view of a processing system configured to simultaneously process a plurality of substrates disposed on a multi-substrate carrier, according to one embodiment.
Figure 1B:
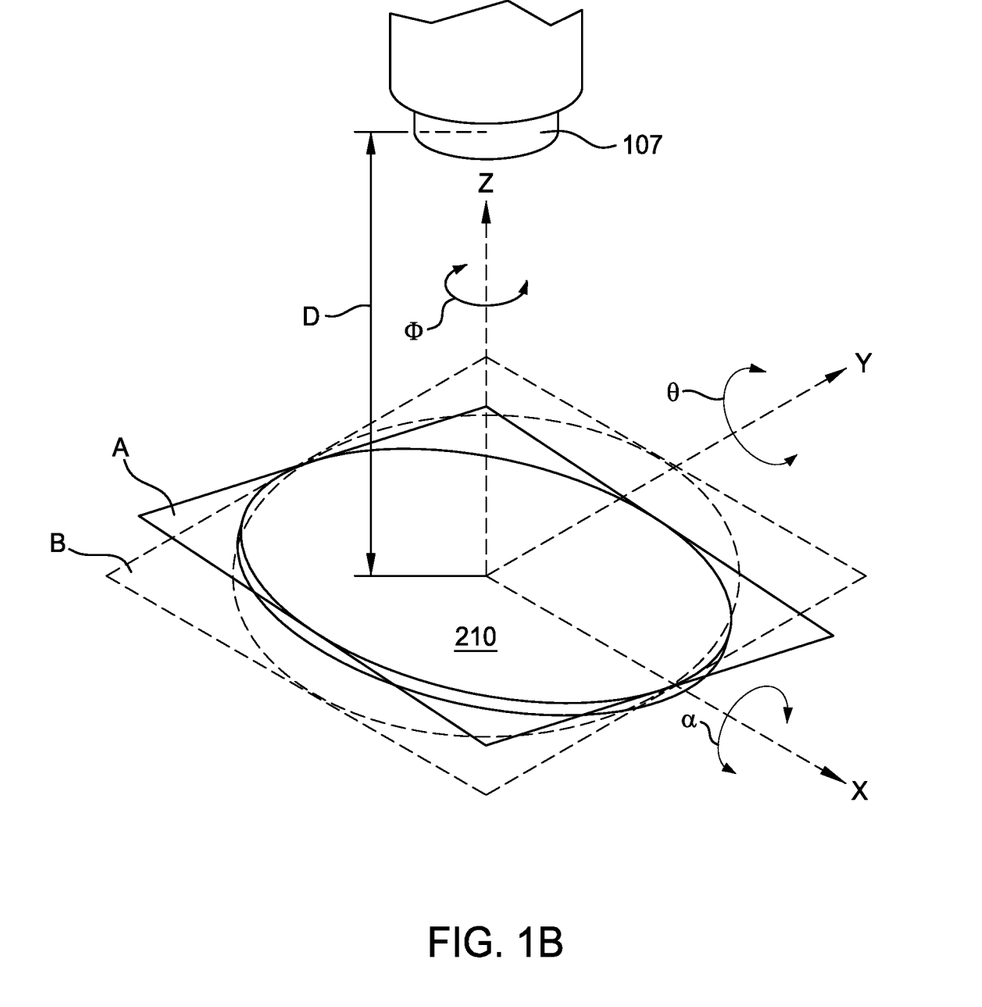
FIG. 1B illustrates the position of a substrate relative to an optical module disposed thereabove, according to one embodiment.

FIG. 1A is a schematic isometric view of a processing system, herein a direct write lithography system, configured to simultaneously process a plurality of substrates disposed on a multi-substrate carrier, according to one embodiment. FIG. 1B illustrates a substrate 210 positioned below an optical module 107 where an actual plane A of the substrate 210 deviates from a desired plane B for exposure by the optical module.

The processing system 100 features a frame 101, a base 102 disposed on the frame 101 and vibrationally isolated therefrom by a plurality of vibration isolators 103 interposed therebetween, a motion stage 104 disposed on a planar base surface 105, and a substrate carrier 200A disposed on the motion stage 104. The processing system 100 further includes a bridge 106 coupled to the base 102, where the bridge 106 spans the base surface 105 and is separated therefrom by a height sufficient to allow the motion stage 104, and substrate carrier 200A with one or more substrates 210 disposed thereon, to pass therebetween. In other embodiments, supports of the bridge 106 are disposed on the base surface 105 and the bridge 106 spans a portion of the base surface 105 disposed between the supports.

Herein, the motion stage 104 is an X-Y linear translation motion stage having a first platform 104a disposed on the base surface 105 and movable relative thereto in an X-direction and a second platform 104b disposed on the first platform 104a and movable relative thereto in a Y-direction. Herein, the X-direction is substantially orthogonal to the span direction of the bridge 106 and the Y direction is substantially parallel to the span direction of the bridge 106, and thus substantially orthogonal to the X-direction. In some embodiments, one or both of the first platform 104a and the second platform 104b are air bearing stages. The motion stage 104 further includes one or more linear guides extending in the X-direction, such as one or more parallel channels 108 disposed in the base surface 105 or parallel rails or tracks (not shown) coupled to or otherwise disposed on the base surface 105. A first linear motor (not shown) moves the motion stage 104 in the X-direction along the linear guides and a second linear motor (not shown) moves the second platform 104b in the Y-direction along one or more second liner guides, such as linear tracks 109, rails, or channels coupled to, disposed on, or disposed in the first platform 104a. Typically, the lateral position, i.e., X-Y position, of the first and second platforms 104a-b and thus the substrate carrier 200A disposed thereon is determined using a system of optical encoders (not shown) and interferometers (not shown).

The bridge 106 supports a plurality of optical modules 107 which are disposed through an opening 110 therein. The plurality of optical modules 107 are positioned to face the base surface 105, and thus face the plurality of substrates 210 disposed on the substrate carrier 200A as the motion stage 104 travels between the bridge 106 and the base surface 105. Typically, a plurality of Z-direction adjusters (not shown) disposed between the second platform 104b and the substrate carrier 200A facilitate leveling of the substrate carrier 200A relative to the bridge 106 and the plurality of optical modules 107 supported therefrom.

In some embodiments, each of the optical modules 107 features one or more of a focus sensor, a level sensor, an image sensor, and a lithography exposure source. Typically, the focus sensor is used to determine a Z-position of the substrate, i.e., the vertical distance D (shown in FIG. 1B) between a surface of a substrate 210 and an optical module 107 when the substrate 210 is positioned therebelow. The level sensor is used to determine the deviation of the substrate plane A from a desired X-Y plane B by measuring a tilt angle θ and tip angle α thereof, where the tilt angle θ is the difference in the rotational position the substrate 210 about a Y-axis compared to the desired X-Y plane B and the tip angle α is the rotational position of the substrate 210 about an X-axis compared to the desired X-Y plane B.

In some embodiments, the level sensor comprises an optical sensor (not shown), such as an interferometer. The optical sensor is used to map surface and, or, layer thickness profiles of a respective substrate along a first axis, such as the X-axis, and a second axis orthogonal to the first axis, such as the Y-axis. Typically, the optical sensor measures a distance to a surface of a transparent (partially reflective) layer, e.g., a resist layer, disposed on the substrate 210 and a distance to a reflective or partially reflective surface of a layer of the substrate 210 disposed therebeneath. The motion stage 104, and thus the plurality of substrates 210 disposed thereon, is moved in the X-direction and the Y-direction after each measurement to capture measurements from a plurality of measurement sites along each respective axis to form X-axis and Y-axis surface profile information. The surface profile information, includes the distance from the optical sensor, and thus the optical module 107, to the surface of the substrate 210 or to a surface of a layer thereof. In some other embodiments, a profile inspection system (not shown) is used to determine the surface profile of each of the substrates 210 disposed on the substrate carrier 200A before the substrate carrier 200A is moved under the plurality of optical modules 107 for substrate processing.

The vertical distance D, tilt angle θ and the tip angle α, and, or, profile information, collectively herein known as positional information, are communicated to a system controller 190. The system controller 190 uses the positional information to adjust the Z-position, i.e., the vertical distance D, and level (θ, α) of each substrate 210 before further processing thereof. Apparatus and methods used to adjust the Z-position and level of each of a plurality of substrates 210 disposed on the substrate carrier 200A are further described in FIGS. 2A-2C.

The image sensor, e.g., a camera, is used to detect one or more fiducial features (not shown), e.g. alignment marks, formed in or on a patterned surface of a substrate 210 which are used by the system controller 190 to determine pattern offset information therefrom, such as one or both of X-Y translational offset and rotational offset, e.g., the rotational position of the pattern formed on a surface of the substrate about a Z-axis disposed through the center of the substrate compared to a desired rotational position, i.e., a rotation angle ϕ.

The lithography exposure source directs and, or, focuses electromagnetic radiation, e.g., one or more UV laser beams, to, on, or beneath a surface of a resist layer deposited on the substrate to form a pattern therein.

The system controller 190 includes a programmable central processing unit (CPU) 191 that is operable with a memory 192 (e.g., non-volatile memory) and support circuits 193. The support circuits 193 are conventionally coupled to the CPU 191 and comprise cache, clock circuits, input/output subsystems, power supplies, and the like, and combinations thereof coupled to the various components of the processing system 100, to facilitate control of an additive manufacturing process. The CPU 191 is one of any form of general purpose computer processor used in an industrial setting, such as a programmable logic controller (PLC), for controlling various components and sub-processors of the processing system 100. The memory 192, coupled to the CPU 191, is non-transitory and is typically one or more of readily available memories such as random access memory (RAM), read only memory (ROM), floppy disk drive, hard disk, or any other form of digital storage, local or remote.

Typically, the memory 192 is in the form of a computer-readable storage media containing instructions (e.g., non-volatile memory), that when executed by the CPU 191, facilitates the operation of the processing system 100. The instructions in the memory 192 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Figure 2A:
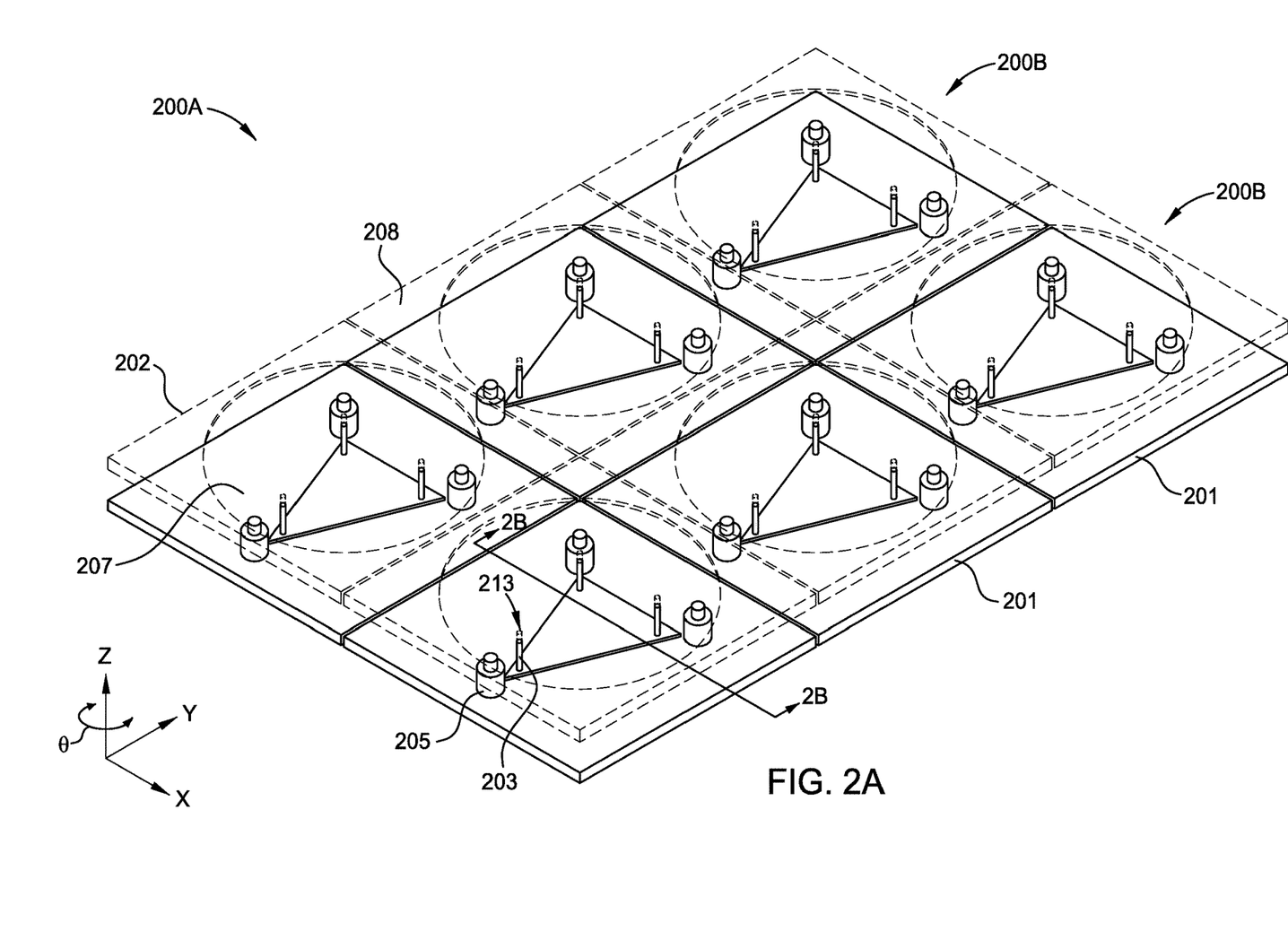
FIG. 2A is a schematic isometric view of the substrate carrier shown in FIG. 1A, according to one embodiment.
Figure 2B:
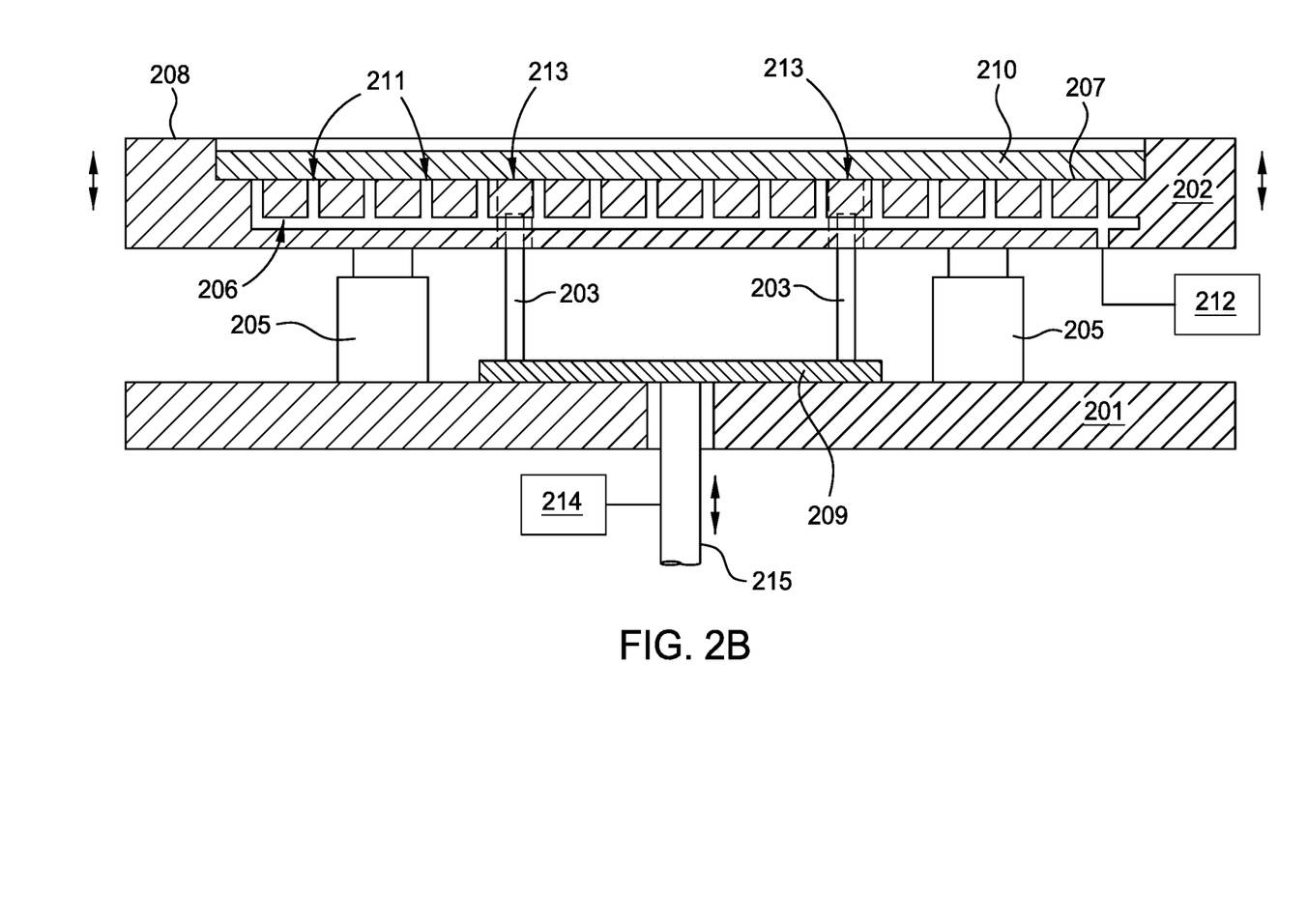
FIG. 2B is a schematic cross-sectional view of a carrier module taken along line 2B-2B of FIG. 2A and further including a substrate disposed on a substrate receiving surface thereof, according to one embodiment.

FIG. 2A is a schematic isometric view of a multi-substrate carrier, herein the substrate carrier 200A shown in FIG. 1A comprising a plurality of carrier modules 200B, according to one embodiment. FIG. 2B is a schematic cross-sectional view of a carrier module 200B taken along lines 2B-2B of FIG. 2A and further including a substrate 210 disposed on a substrate receiving surface 207 thereof. Typically, each carrier module 200B is positioned on and fixedly coupled to a motion stage, such as the second platform 104b of the motion stage 104 described in FIG. 1A, to facilitate the simultaneous processing of a plurality of substrates, e.g., simultaneous patterning of a plurality of substrates during a direct write lithography process.

Herein, the substrate carrier 200A includes a plurality of carrier modules 200B each featuring a base plate 201, a plurality of Z-direction actuators 205 disposed on the base plate 201, and a carrier plate 202 disposed on the plurality of Z-direction actuators 205. Herein, each of the carrier plates 202 are independent from one another so that a motion imparted to one or the carrier plates 202 by the plurality of Z-direction actuators does not also impart a motion to an adjacent carrier plate 202. Herein, each of the carrier modules 200B features a separate and independent base plate 201. In other embodiments, the plurality of carrier modules 200B share a common base plate (not shown). A plurality of lift pins 203 movably disposed through a corresponding plurality of first lift pin openings 213 in the carrier plate 202 facilitate substrate handling and transfer of the substrate 210 to and from the substrate receiving surface 207 of the carrier plate 202 by enabling positioning of the substrate above the carrier plate 202 to enable a robot handler to position the substrate 210 on, or remove a substrate 210 from, the lift pins 203 when they extend above the carrier plate 202.

Herein, the plurality of lift pins 203 are disposed on a lift pin plate 209 which is disposed on a shaft 215 extending through the base plate 201 as shown in FIG. 2B. A lift actuator 214, coupled to the shaft 215, raises and lowers the shaft 215, and thus the plurality of lift pins 203. When the shaft 215 is in a raised position (not shown) the lift pins 203 extend above the substrate receiving surface 207 of the carrier plate 202 to lift the substrate 210 therefrom which enables access to the substrate 210 by a robot handler (not shown). When the shaft 215 is in a lowered position the lift pins 203 are flush with or below the substrate receiving surface 207 and the substrate 210 rests directly thereon. Herein, the substrate receiving surface 207 is recessed from a face surface 208 of the carrier plate 202 and is disposed inwardly therefrom so that the face surface 208 circumscribes the substrate 210 when the substrate is disposed on the substrate receiving surface 207. The substrate 210 is secured to the substrate receiving surface 207 using a vacuum source 212, such as a dedicated vacuum pump. The vacuum source 212 is in fluid communication with a plurality of first vacuum openings 211 disposed in the substrate receiving surface 207 through one or more vacuum conduits 206 disposed in the carrier plate 202.

Figure 2C:
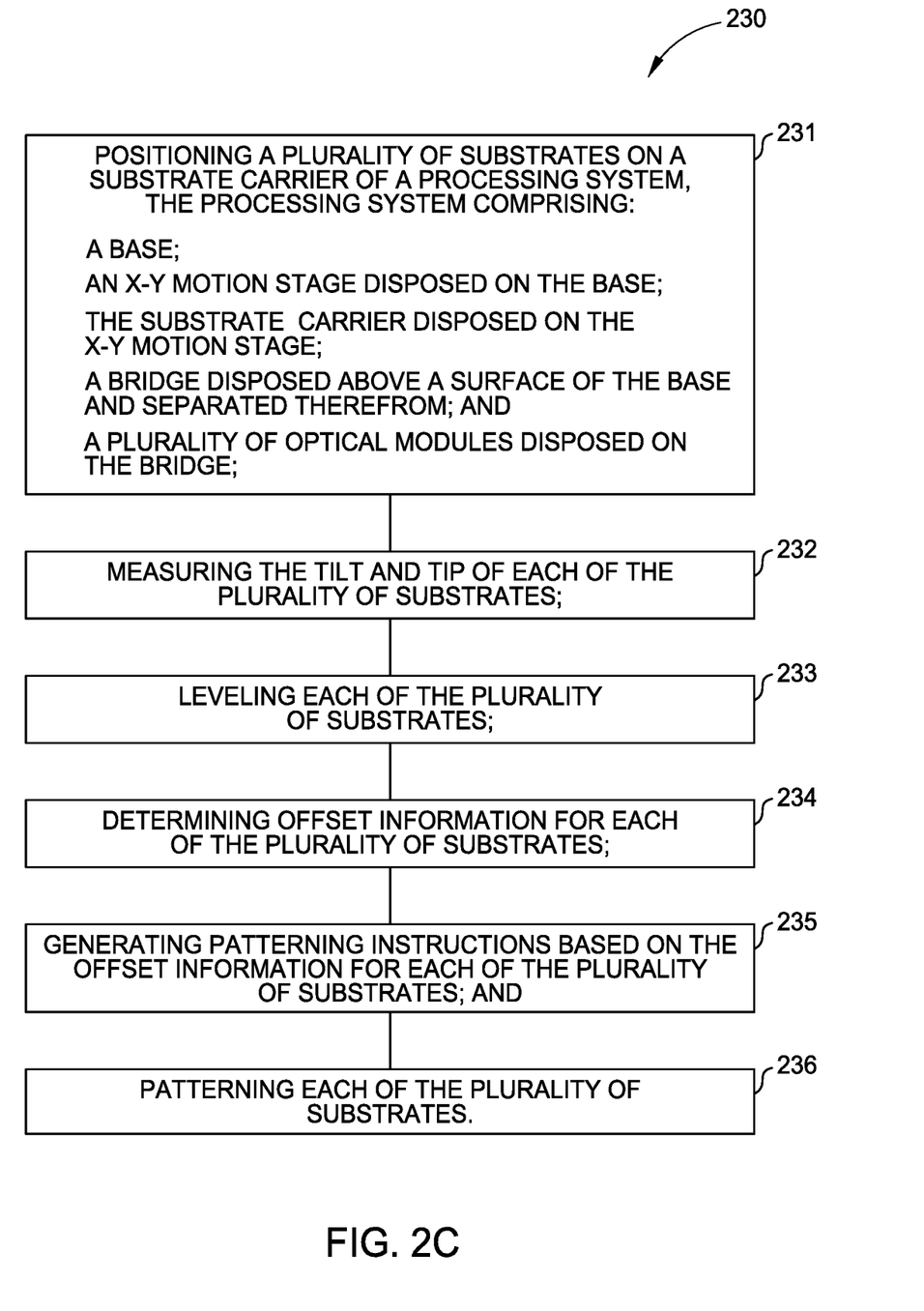
FIG. 2C is a flow diagram setting forth a method of simultaneously processing a plurality of substrates, according to one embodiment.

FIG. 2C is a flow diagram setting forth a method of simultaneously processing a plurality of substrates, according to one embodiment. At activity 231 the method 230 includes positioning a plurality of substrates on a multi-substrate carrier of a substrate processing system. Herein, the substrate processing system includes a base, a motion stage disposed on the base, the substrate carrier disposed on the motion stage; a bridge disposed above a surface of the base and separated therefrom, and a plurality of optical modules disposed on the bridge. In some embodiments, the substrate processing system is the processing system described in FIG. 1A and, or, the multi-substrate carrier is the substrate carrier 200A described in FIGS. 2A-2B. In some embodiments, the substrates are wafers, such as silicon wafers used in semiconductor device manufacturing processes or semiconductor device packaging processes, where each of the wafers has a circular surface with a diameter of 150 mm, 200 mm, 300 mm, 450 mm, or any other suitable size. In other embodiments, the plurality substrates are rectangular or circular panels, such as glass or plastic panels or reconstituted substrates having a plurality singulated devices embedded therein as part of a fan out wafer level packaging (FOWLP) scheme. In some embodiments, the method 230 includes pre-aligning each of the substrates to a desired orientation before positioning each of the substrates on the substrate support. In some embodiments, each of the substrates is pre-aligned at a pre-alignment station coupled to the processing system. Herein, each of the substrates is positioned on a corresponding carrier plate of the multi-substrate carrier.

At activities 232 and 233 the method 230 respectively includes measuring the tilt and tip of each of the plurality of substrates and based on the tilt and tip measurements, independently leveling each of the substrates using one or more Z-direction actuators disposed beneath the corresponding carrier plate. In some embodiments, the method 230 further includes determining a vertical distance between the substrate and an optical module positioned thereabove and adjusting a height of the carrier plate, and thus the substrate disposed thereon, using the one or more Z-direction actuators. Here, three Z-direction actuators 205 are evenly spaced from a center point of a substrate on the carrier plate, and each Z-direction actuator 205 is disposed 120 degrees from the other two about the center point. Thus, by relative Z-direction movement of the Z-direction actuators 205, a desired orientation of the upper surface of a substrate supported thereon, along the tilt angle θ and the tip angle α, can be achieved. In some embodiments, a focus sensor is used to determine the vertical distance between the substrate and the optical module.

At activity 234 the method 230 includes determining offset information for each of the plurality of substrates. Typically, offset information includes one or both of X-Y translational offset and rotational offset of a first pattern formed in or on a surface of a substrate. In some embodiments, the method 230 further includes comparing the offset information to predetermined values, e.g., control limits, and re-aligning the substrate if the offset information exceeds the predetermined value. Herein, re-aligning the substrate comprises returning the substrate to a pre-alignment station coupled to the processing system, rotating the substrate to a desired orientation, and positioning the re-aligned substrate back on the same or a different substrate receiving surface of a carrier plate.

At activity 235 the method includes generating patterning instructions based on the offset information for each of the plurality of substrates. In some embodiments, the patterning instructions compensate for one or both of a X-Y translational offset and a rotational offset of each of the plurality of substrates enabling simultaneous patterning of a plurality of substrates having different X-Y translational and rotational offsets from one another.

At activity 236 the method includes patterning each of the plurality of substrates to form an exposure pattern thereon. Typically, patterning each of the plurality of substrates to form the exposure pattern includes moving the motion stage under the plurality of optical modules which direct and, or, focus electromagnetic radiation to, on, or beneath a surface of a resist layer disposed on the substrate to form an exposure pattern therein. In some embodiments, the electromagnetic radiation is UV light and the resist layer is a UV sensitive resist layer. In some embodiments, patterning the plurality of substrates includes simultaneously exposing two or more substrates to electromagnetic radiation from the plurality of optical modules to form the exposure pattern thereon.

Figure 3A:
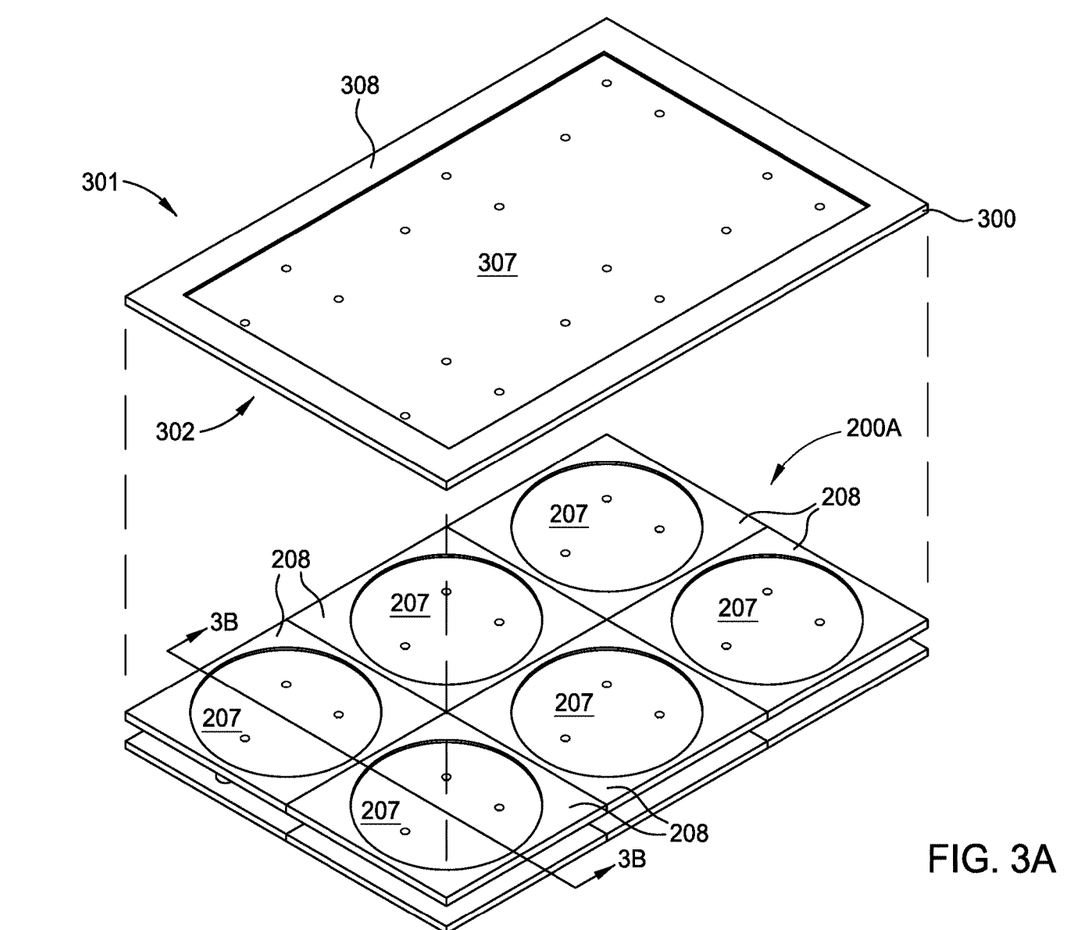
FIG. 3A is a schematic isometric view of a panel adaptor plate used with the substrate carrier shown in FIG. 2A, according to one embodiment.
Figure 3B:
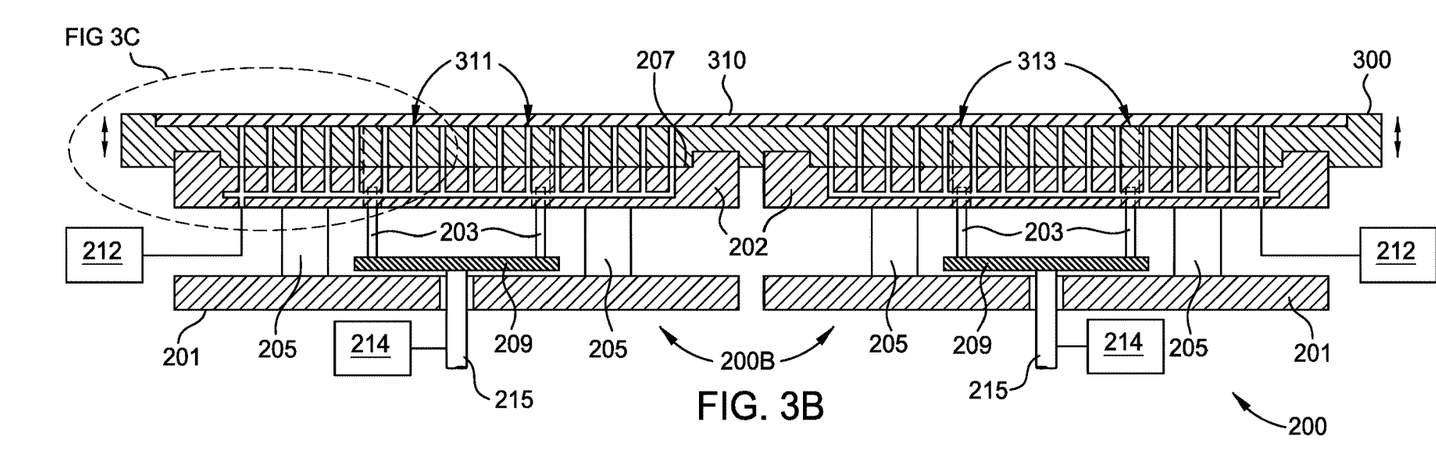
FIG. 3B is an isometric cross-sectional view of the substrate carrier taken along line 3B-3B of FIG. 3A further including the adaptor plate disposed thereon and a panel disposed on the adaptor plate.
Figure 3C:
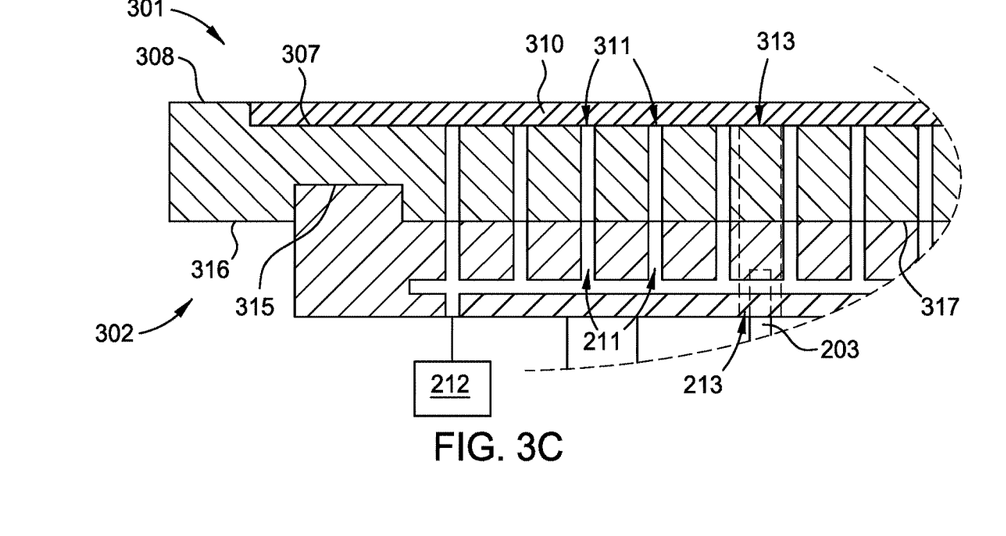
FIG. 3C is a close-up view of a portion of FIG. 3B.

FIG. 3A is a schematic isometric view of an adaptor plate 300 used with the substrate carrier 200A, according to one embodiment. FIG. 3B is a isometric cross-sectional view of the substrate carrier 200A taken along line 3B-3B of FIG. 3A further including the adaptor plate 300 disposed thereon and a panel 310 disposed on the adaptor plate 300. FIG. 3C is a close-up view of a portion of FIG. 3B.

Herein, the adaptor plate 300 features a first side 301 and a second side 302 opposite the first side 301. The first side 301 supports a single panel 310 substrate during panel processing and includes a first frame surface 308 forming the perimeter of the first side 301 and a panel receiving surface 307, herein a rectangular surface, recessed from the first frame surface 308 and disposed inwardly therefrom. The second side 302 fits on the substrate carrier 200A and includes a plurality of mating surfaces corresponding to the respective protruding and recessed surfaces of the substrate carrier 200A and further includes a second frame surface 316 forming a perimeter of the second side 302. The plurality of mating surfaces include one or more recessed surfaces 315 sized and located to mate with the face surfaces 208 of the substrate carrier 200A and a plurality of protruding surfaces 317 sized and located to mate with the plurality of substrate receiving surfaces 207 of the substrate carrier 200A. Herein, the one or more recessed surfaces 315 are recessed from both the plurality of protruding surfaces 317 and the second frame surface 316 so that the second frame surface 316 circumscribes a perimeter of the substrate carrier 200A when the adaptor plate 300 is positioned thereon.

A plurality of second lift pin openings 313 formed through the adaptor plate 300 are located to be aligned with the plurality of first lift pin openings 213 formed through each of the carrier plates 202 when the adaptor plate 300 is positioned on the substrate carrier 200A. The plurality of lift pins 203 of each of the carrier modules 200B are movably disposed through the corresponding first lift pin openings 213 and further through the corresponding plurality of second lift pin openings 313. When the lift pins 203 are in a raised position they lift the panel 310 from the panel receiving surface 307 enabling access thereto by a robot handler (not shown), as well as thus positioned to receive another panel to be processed from the robot handler. When the lift pins 203 are in a lowered position the upper ends thereof are flush with or below the panel receiving surface 307 and the panel 310 rests directly thereon. Typically, the panel 310 is secured to the panel receiving surface 307 using the vacuum source 212. The vacuum source 212 is in fluid communication with a plurality of second vacuum openings 311 disposed through the adaptor plate 300 where each of the second vacuum openings 311 is aligned (in registration with) and in fluid communication with a corresponding first vacuum opening when the adaptor plate 300 is positioned on the substrate carrier 200A.

In some embodiments, the plurality of Z-direction actuators 205 are placed in a zero position (not actuated position) before or after the adaptor plate 300 is positioned thereon. In some of those embodiments, a plurality of Z-direction adjustors (not shown) disposed between the substrate carrier 200A and the second platform 104b (shown in FIG. 1A) are used to adjust the level, i.e., tip and tilt, and the Z-position of the substrate carrier 200A, and thus the adaptor plate 300 and the panel 310 disposed thereon.

In other embodiments, the level, i.e. tip and tilt, and the Z-position of the adaptor plate 300, and thus the panel 310 disposed thereon, is desirably adjusted by adjusting the level and Z-position of each of the carrier plates 202 using the Z-direction actuators 205 disposed therebeneath.

The adaptor plate 300 described herein desirably enables the conversion of a processing system, such as the processing system 100 described in FIG. 1A, from a multi-substrate processing configuration to a large area panel processing configuration with relatively minimal processing system downtime.

While the foregoing is directed to embodiments of the present disclosure, other and further embodiments of the disclosure may be devised without departing from the basic scope thereof, and the scope thereof is determined by the claims that follow.

The invention claimed is:

1. A substrate carrier, comprising:
a plurality of carrier modules arranged for concurrent processing of a plurality of substrates during a lithography process, each of the carrier modules comprising:
a base plate;
a plurality of Z-actuators disposed on the base plate; and
a carrier plate for supporting an individual one of the plurality of substrates, wherein the carrier plate is disposed on the plurality of Z-actuators,
wherein the carrier plate of each of the plurality of carrier modules is separate and independent from the carrier plates of adjacent ones of the plurality of carrier modules, and each plurality of Z-actuators is operable to adjust a height and level of the carrier plate independently from heights and levels of the carrier plates of adjacent ones of the plurality of carrier modules.

2. The substrate carrier of claim 1, wherein each of the plurality of carrier modules further comprise a plurality of lift pins movably disposed through the carrier plate.

3. The substrate carrier of claim 2, wherein each carrier plate comprises a face surface and a substrate receiving surface recessed from the face surface and disposed inwardly therefrom so that the face surface circumscribes a substrate when the substrate is disposed on the substrate receiving surface.

4. The substrate carrier of claim 1, wherein each carrier plate comprises a face surface and a substrate receiving surface recessed from the face surface and disposed inwardly therefrom so that the face surface circumscribes a substrate when the substrate is disposed on the substrate receiving surface.

5. A substrate carrier, comprising:
a plurality of carrier modules, each of the carrier modules comprising:
a base plate;
a plurality of Z-actuators disposed on the base plate; and
a carrier plate disposed on the plurality of Z-actuators; and
a panel adaptor plate disposed on the plurality of carrier modules.

6. The substrate carrier of claim 5, wherein the panel adaptor plate comprises:
a first side having a first frame surface forming a perimeter thereof and panel receiving surface recessed from the first frame surface and disposed inwardly therefrom; and
a second side opposite the first side, the second side having a plurality of mating surfaces and a second frame surface forming a perimeter of the second side, wherein the plurality of mating surfaces comprise one or more recessed surfaces sized and located to mate with the face surfaces of the substrate carrier and one or more protruding surfaces sized and located to mate with the substrate receiving surfaces of the substrate carrier.

7. The substrate carrier of claim 6, wherein a plurality of lift pin openings formed through panel adaptor plate are aligned with a respective plurality of lift pins formed through each of the carrier plates.

8. The substrate carrier of claim 5, wherein the carrier plate of each carrier module is independent from the carrier plates of adjacent carrier modules.

9. A processing system, comprising:
a base;
a motion stage disposed on the base;
a bridge disposed above a surface of the base and separated therefrom;
a plurality of optical modules disposed on the bridge; and
a substrate carrier disposed on the motion stage, the substrate carrier comprising a plurality of carrier modules arranged for concurrent patterning of a plurality of substrates using the plurality of optical modules, each of the carrier modules comprising:
a base plate;
a plurality of Z-actuators disposed on the base plate; and
a carrier plate for supporting an individual one of the plurality of substrates, wherein the carrier plate is disposed on the plurality of Z-actuators,
wherein the carrier plate of each of the plurality of carrier modules is separate and independent from the carrier plates of adjacent ones of the plurality of carrier modules, and each plurality of Z-actuators is operable to adjust a height and level of the carrier plate independently from heights and levels of the carrier plates of adjacent ones of the plurality of carrier modules.

10. A processing system, comprising:
a base;
a motion stage disposed on the base;
a substrate carrier disposed on the motion stage, the substrate carrier comprising a plurality of carrier modules;
a bridge disposed above a surface of the base and separated therefrom;
a plurality of optical modules disposed on the bridge; and
a panel adaptor plate disposed on the plurality of carrier modules.

11. The processing system of claim 10, wherein the panel adaptor plate comprises:
a first side having a first frame surface forming a perimeter thereof and panel receiving surface recessed from the first frame surface and disposed inwardly therefrom; and
a second side opposite the first side, the second side having a plurality of mating surfaces and a second frame surface forming a perimeter of the second side, wherein the plurality of mating surfaces comprise one or more recessed surfaces sized and located to mate with the face surfaces of the substrate carrier and one or more protruding surfaces sized and located to mate with the substrate receiving surfaces of the substrate carrier.

12. The processing system of claim 10, wherein each of the carrier modules comprises:
a base plate;
a plurality of Z-actuators disposed on the base plate; and
a carrier plate disposed on the plurality of Z-actuators.

13. The processing system of claim 12, wherein each of the plurality of carrier modules further comprise a plurality of lift pins movably disposed through the carrier plate.

14. The processing system of claim 13, wherein each carrier plate comprises a face surface and a substrate receiving surface recessed from the face surface and disposed inwardly therefrom so that the face surface circumscribes a substrate when the substrate is disposed on the substrate receiving surface.

15. A method of patterning a plurality of substrates, comprising:
- positioning a plurality of substrates on a substrate carrier of a processing system, the processing system comprising:
  - a base;
  - a motion stage disposed on the base;
  - the substrate carrier disposed on the motion stage;
  - a bridge disposed above a surface of the base and separated therefrom; and
  - a plurality of optical modules disposed on the bridge;
- positioning the substrate carrier under the plurality of optical modules;
- independently leveling each of the plurality of substrates;
- determining offset information for each of the plurality of substrates;
- generating patterning instructions based on the offset information for each of the plurality of substrates; and
- patterning each of the plurality of substrates using the plurality of optical modules.

16. The method of claim 15, wherein the plurality of optical modules each comprise a focus sensor, a level sensor, an image sensor, a lithography exposure source, or a combination thereof.

17. The method of claim 15, wherein the offset information includes X-Y translational offset information and rotational offset information for a first pattern formed on a surface of the substrate.

18. The method of claim 15, wherein two or more of the plurality of substrates are patterned simultaneously.

19. The method of claim 15, wherein the substrate carrier comprises a plurality of carrier modules, each comprising:
- a base plate;
- a plurality of Z-actuators disposed on the base plate; and
- a carrier plate disposed on the plurality of Z-actuators.

20. The method of claim 19, wherein the substrate carrier further comprises a plurality of lift pins movably disposed through the carrier plate.

* * * * *